United States Patent
Reiter et al.

(10) Patent No.: US 12,278,648 B2
(45) Date of Patent: Apr. 15, 2025

(54) SYSTEM AND METHODS FOR RAMP CONTROL

(71) Applicant: Microchip Technology Incorporated, Chandler, AZ (US)

(72) Inventors: Andreas Reiter, Feldkirchen-Westerham (DE); Yong Yuenyongsgool, Gilbert, AZ (US); Stephen Bowling, Chandler, AZ (US); John Day, Marlborough, MA (US); Alex Dumais, Boise, ID (US); Justin Oshea, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 178 days.

(21) Appl. No.: 18/095,933

(22) Filed: Jan. 11, 2023

(65) Prior Publication Data
US 2024/0022257 A1    Jan. 18, 2024

Related U.S. Application Data

(60) Provisional application No. 63/389,171, filed on Jul. 14, 2022.

(51) Int. Cl.
*H03M 1/56* (2006.01)
(52) U.S. Cl.
CPC ..................... *H03M 1/56* (2013.01)
(58) Field of Classification Search
CPC .............. H03M 1/56; H03K 7/08; H03K 4/08
USPC ........................................................ 341/169
See application file for complete search history.

(56) References Cited

U.S. PATENT DOCUMENTS

| | | | |
|---|---|---|---|
| 4,504,741 A | 3/1985 | Armitage | 327/135 |
| 2010/0208112 A1* | 8/2010 | Lim | G11C 7/1051 |
| | | | 348/294 |
| 2014/0014815 A1 | 1/2014 | Lee et al. | 250/208.1 |
| 2018/0323793 A1 | 11/2018 | Onde et al. | |
| 2021/0067723 A1* | 3/2021 | Kim | H04N 25/78 |
| 2021/0068823 A1* | 3/2021 | Nicholas | A61B 17/0686 |

OTHER PUBLICATIONS

International Search Report and Written Opinion, Application No. PCT/US2023/010786, 12 pages, May 16, 2023.

* cited by examiner

*Primary Examiner* — Jean B Jeanglaude
(74) *Attorney, Agent, or Firm* — SLAYDEN GRUBERT BEARD PLLC

(57) ABSTRACT

A device including an input to receive a clock signal, a ramp start program register, a ramp start active register, a ramp stop program register, a ramp stop active register, a ramp slope program register, a ramp slope active register, an update controller, the update controller to update, based on a programmable condition, respectively, the ramp start active register contents, the ramp stop active register contents and the ramp slope active register contents, and a ramp controller to generate a ramp signal, the ramp signal to begin at the value reflective of the ramp start active register contents, the ramp signal to change value at each cycle of the clock signal based on the value reflective of the ramp slope active register contents, and the ramp signal to stop at the value reflective of the ramp stop active register contents.

23 Claims, 5 Drawing Sheets

SYSTEM AND METHODS FOR RAMP CONTROL

RELATED PATENT APPLICATION

Figure 1:
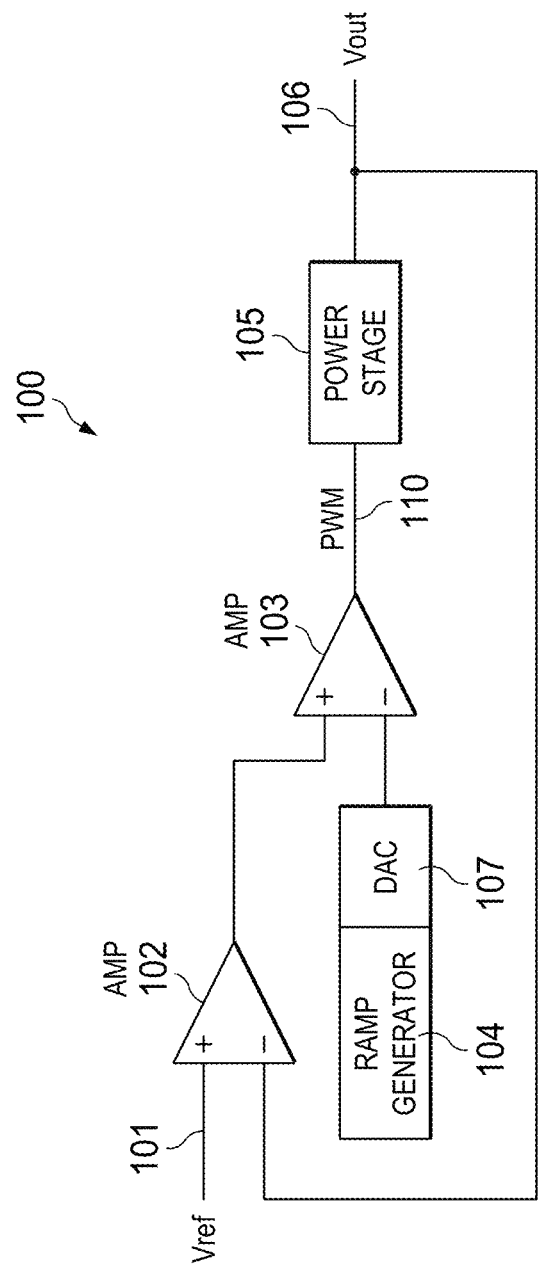

This application claims priority to commonly owned U.S. Patent Application No. 63/389,171 filed Jul. 14, 2022, the entire contents of which are hereby incorporated by reference for all purposes.

TECHNICAL FIELD

The present disclosure relates to control of a ramp signal in an electronic device.

BACKGROUND

An accurate and configurable ramp signal is needed in many electronics applications.

As one of various examples, switching power converters may use a voltage ramp in generating a gate drive signal for power devices. Converters may generate a voltage ramp triggered by PWM events and may be limited to generating a ramp signal based on periodic events in the PWM signal.

There is a need for a configurable ramp signal which can be customized for a specific use case and is not limited to timing requirements of the specific application. For a switched power converter, this configurable ramp signal may reduce inductor current perturbation during load step by applying a ramp across all converter phases instead of a common staircase reference.

SUMMARY

A peripheral device including an input to receive a clock signal, a ramp start program register, a ramp start active register, a ramp stop program register, a ramp stop active register, a ramp slope program register, a ramp slope active register, an update controller, the update controller to update, based on a programmable condition, respectively, the ramp start active register contents with a content of the ramp start program register, the ramp stop active register contents with a content of the ramp stop program register contents and the ramp slope active register contents with a content of the ramp slope program register contents, and a ramp controller to generate a ramp signal, the ramp signal to begin at the value reflective of the ramp start active register contents, the ramp signal to change value at each cycle of the clock signal based on the value reflective of the ramp slope active register contents, and the ramp signal to stop at the value reflective of the ramp stop active register contents.

A system including an input to receive an input signal, an input to receive a clock signal, a ramp start program register, a ramp start active register, a ramp stop program register, a ramp stop active register, a ramp slope program register, a ramp slope active register, an update controller to update, based on a programmable condition, respectively, the ramp start active register contents with a content of the ramp start program register, the ramp stop active register contents with a content of the ramp stop program register, and the ramp slope active register contents with a content of the ramp slope program register, and a ramp controller to generate a ramp signal, the ramp signal to begin at the value reflective of the ramp start active register contents, the ramp signal to change value at each cycle of the clock signal based on the value reflective of the ramp slope active register contents, and the ramp signal to stop at the value reflective of the ramp stop active register contents, and a comparator to compare the input signal to the ramp signal and to output a PWM signal.

A method including generating a ramp signal, the ramp signal to begin at the value reflective of a ramp start active register contents, the ramp signal to change value at each cycle of a clock signal based on the value reflective of a ramp slope active register contents, and the ramp signal to stop at the value reflective of the ramp stop active register contents, updating, based on a programmable condition, respectively, the ramp start active register contents with the value reflective of the ramp start program register contents, the ramp stop active register contents with the value reflective of the ramp stop program register contents, and the ramp slope active register contents with the value reflective of the ramp slope program register contents, and generating a PWM signal based on a comparison of the ramp signal and an input signal.

DESCRIPTION

FIG. 1 illustrates one of various examples of a ramp generator 104 operating in a switched power converter 100. The switched power converter 100 of FIG. 1 converts an input DC reference voltage Vref 101 to an equivalent switched output voltage Vout 106. Downstream filtering stages (not shown) may further filter output voltage Vout 106 to minimize output ripple.

Vref 101 may be coupled to a non-inverting input of feedback amplifier 102. Vout 106 may be coupled to an inverting input of feedback amplifier 102. Output of feedback amplifier 102 may be coupled to a non-inverting input of amplifier 103. Ramp generator 104 may generate a value to be input to a digital-to-analog converter (DAC) 107. The value may be provided by one or more programmable register settings, or may be provided by a voltage reference input, or may be provided by a method not explicitly disclosed. The output of DAC 107 may be coupled to an inverting input of amplifier 103. Amplifier 103 may comprise a comparator, comparing the ramp signal at the output of DAC 107 and the output of amplifier 102. Output of amplifier 103 may generate PWM signal 110. PWM signal 110 may be input to power stage 105. Output of power stage 105 may be the converter output voltage Vout 106.

Figure 2:
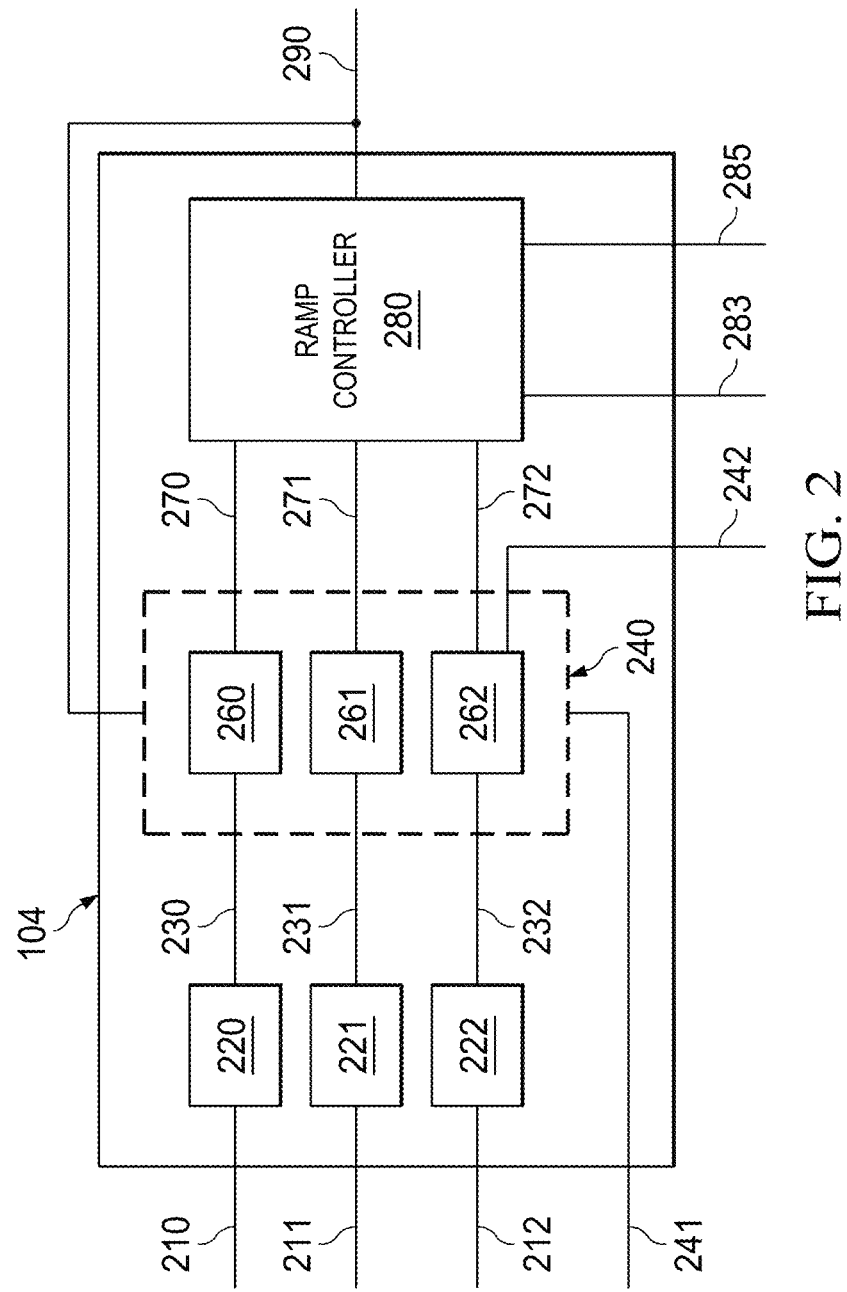

FIG. 2 illustrates details of one of various examples of ramp generator 104. Input 210 may be provided to ramp start program register 220. In one of various examples, input 210 may provide a value to be stored in ramp start program register 220. Input 210 may be a single wire connection providing data and control information to ramp start program register 220. The contents of ramp start program register 220 may be updated based on a predetermined communication protocol transmitted to ramp start program register 220 on input 210. In one of various examples, input 210 may be a bussed connection providing a clock signal, a data value and an enable signal. The contents of ramp start program register 220 may be updated to the data value on an edge of the clock signal when the enable signal is asserted. Ramp start program value 230 may be a value reflective of the contents of ramp start program register 220. Contents of ramp start program register 220 may be updated using other methods not explicitly disclosed in this specification.

Input 211 may be provided to ramp stop program register 221. In one of various examples, input 211 may provide a value to be stored in ramp stop program register 221. Input 211 may be a single wire connection providing data and control information to ramp stop program register 221. The contents of ramp stop program register 221 may be updated based on a predetermined communication protocol transmitted to ramp stop program register 221 over input 211. In one of various examples, input 211 may be a bussed connection providing a clock signal, a data value and an enable signal. The contents of ramp stop program register 221 may be updated to the data value on an edge of the clock signal when the enable signal is asserted. Ramp stop program value 231 may be a value reflective of the contents of ramp stop program register 221. Contents of ramp stop program register 221 may be updated using other methods not explicitly disclosed in this specification.

Input 212 may be provided to ramp slope program register 222. In one of various examples, input 212 may provide a value to be stored in ramp slope program register 222. Input 212 may be a single wire connection providing data and control information to ramp slope program register 222. The contents of ramp slope program register 222 may be updated based on a predetermined communication protocol transmitted to ramp slope program register 222 over input 212. In one of various examples, input 212 may be a bussed connection providing a clock signal, a data value and an enable signal. The contents of ramp slope program register 222 may be updated to the data value on an edge of the clock signal when the enable signal is asserted. Ramp slope program value 232 may be a value reflective of the contents of ramp slope program register 222. Contents of ramp slope program register 222 may be updated using other methods not explicitly disclosed in this specification. Ramp slope program register 222 may contain a positive or a negative value. Positive values of ramp slope program register 222 may be used to generate a positive ramp. Negative values of ramp slope program register 222 may be used to generate a negative ramp.

Update controller 240 may receive as input, respectively, ramp start program value 230 from ramp start program register 220, ramp stop program value 231 from ramp stop program register 221, and ramp slope program value 232 from ramp slope program register 222. Update controller 240 may receive input from PWM signal 242 and external signal 241. Update controller 240 may comprise ramp start active register 260, ramp stop active register 261 and ramp slope active register 262.

Update controller 240 may update the contents of ramp start active register 260 based on a programmable condition and based on the value of ramp start program value 230. In one of various examples, update controller 240 may, when the contents of ramp start program register 220 change, and thus ramp start program value 230 changes, update the contents of ramp start active register 260 with ramp start program value 230. In one of various examples, update controller 240 may, when external signal 241 changes polarity, update the contents of ramp start active register 260 with ramp start program value 230. In one of various examples, update controller 240 may, when PWM signal 242 reaches a predetermined point in the PWM period, update the contents of ramp start active register 260 with ramp start program value 230. In one of various examples, update controller 240 may, when ramp signal 290 reaches a value reflective of the contents of ramp stop active register 261, update the contents of ramp start active register 260 with ramp start program value 230. In one of various examples, update controller 240 may, when ramp signal 290 reaches a value reflective of the contents of ramp start active register 260, update the contents of ramp start active register 260 with ramp start program value 230. Ramp start active value 270 may be a value reflective of the contents of ramp start active register 260.

Update controller 240 may update the contents of ramp stop active register 261 based on a programmable condition and based on the value of ramp stop program value 231. In one of various examples, update controller 240 may, when the contents of ramp stop program register 221 change, and thus ramp stop program value 231 changes, update the contents of ramp stop active register 261 with ramp stop program value 231. In one of various examples, update controller 240 may, when external signal 241 changes polarity, update the contents of ramp stop active register 261 with ramp stop program value 231. In one of various examples, update controller 240 may, when PWM signal 242 reaches a predetermined point in the PWM period, update the contents of ramp stop active register 261 with ramp stop program value 231. In one of various examples, update controller 240 may, when ramp signal 290 reaches a value reflective of the contents of ramp stop active register 261, update the contents of ramp stop active register 261 with ramp stop program value 231. In one of various examples, update controller 240 may, when ramp signal 290 reaches a value reflective of the contents of ramp start active register 260, update the contents of ramp stop active register 261 with ramp stop program value 231. Ramp stop active value 271 may be a value reflective of the contents of ramp stop active register 261.

Update controller 240 may update the contents of ramp slope active register 262 based on a programmable condition and based on the value of ramp slope program value 232. In one of various examples, update controller 240 may, when the contents of ramp slope program register 222 change, and thus ramp slope program value 232 changes, update the contents of ramp slope active register 262 with ramp slope program value 232. In one of various examples, update controller 240 may, when external signal 241 changes polarity, update the contents of ramp slope active register 262 with ramp slope program value 232. In one of various examples, update controller 240 may, when PWM input 242 reaches a predetermined point in the PWM period, update the contents of ramp slope active register 262 with ramp slope program value 232. In one of various examples, update controller 240 may, when ramp signal 290 reaches a value reflective of the contents of ramp stop active register 261, update the contents of ramp slope active register 262 with ramp slope program value 232. In one of various examples, update controller 240 may, when ramp signal 290 reaches a value reflective of the contents of ramp start active register 260, update the contents of ramp slope active register 262 with ramp slope program value 232. Ramp slope active value 272 may be a value reflective of the contents of ramp slope active register 262.

Ramp controller 280 may receive as input, respectively, ramp start active value 270, ramp stop active value 271, and ramp slope active value 272. Ramp start active value 270 may represent a starting value of a ramp signal. Ramp stop active value 271 may represent a stop value of a ramp signal. Ramp slope active value 272 may represent a slope value of a ramp signal.

Clock signal 285 may be provided to ramp controller 280. Trigger signal 283 may be provided to ramp controller 280. Ramp controller 280 may generate a ramp signal 290 according to one of various methods, ramp signal 290 based at least on ramp start active value 270, ramp stop active value 271, ramp slope active value 272 and clock signal 285.

Ramp generator 104 as illustrated in FIG. 2 may be a peripheral device in communication with a microcontroller device. In one of various examples, ramp generator 104 may be implemented in a microcontroller to generate a ramp signal.

Figure 3:
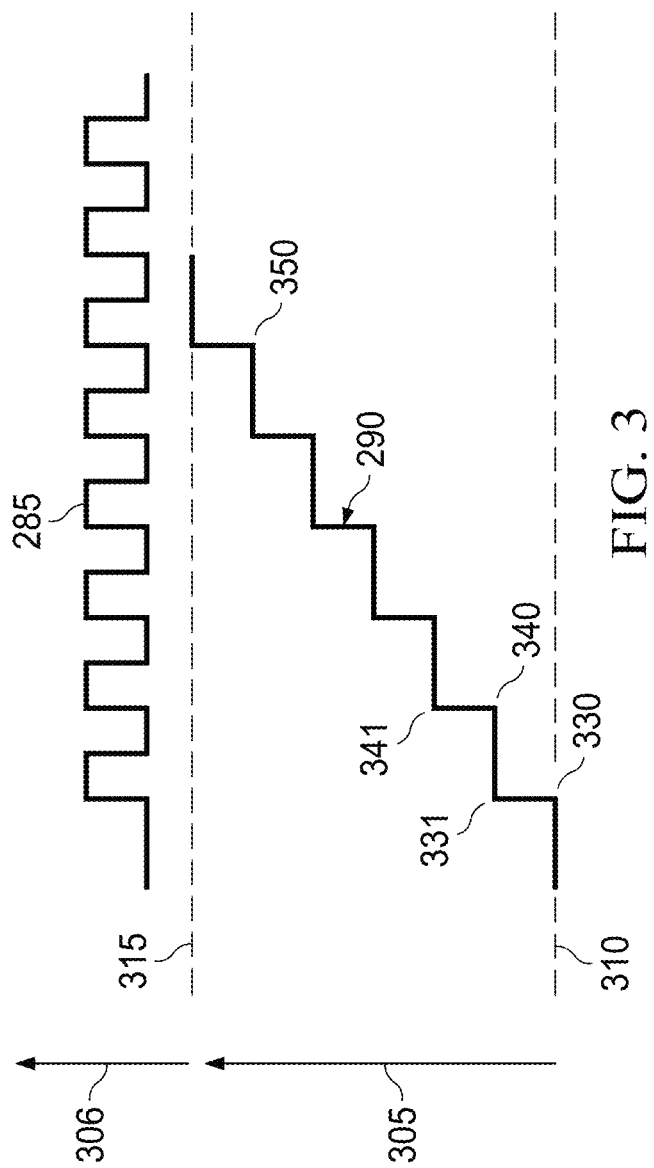

FIG. 3 illustrates one of various examples of a ramp signal 290 generated by ramp controller 280. Ramp signal 290 is illustrated as a solid line in FIG. 3. Vertical axis 305 of FIG. 3 may represent amplitude of ramp signal 290. Vertical axis 306 of FIG. 3 may represent amplitude of clock signal 285. The horizontal dimension of FIG. 3 may represent time. Ramp signal 290 may start at a ramp start value 310. Ramp start value 310 may be equal to ramp start active value 270. Ramp signal 290 may stop at a ramp stop value 315. Ramp stop value 315 may be equal to ramp stop active value 271.

At time 330, a trigger signal may initiate a ramp cycle. The trigger signal may be trigger signal 283 as illustrated in FIG. 2. In one of various examples, the trigger signal may be an internal control signal, including but not limited to a clock signal, a signal indicating the end of a PWM period or a signal based on a fixed frequency. Once the ramp cycle is initiated, ramp signal 290 may increase to a level 331. Level 331 may be based on ramp start level 310, ramp stop level 315, and ramp slope active value 272. As indicated above, ramp start level 310 may be a value equal to ramp start active value 270, and ramp stop level 315 may be a value equal to ramp stop active value 272.

At the next rising edge of clock signal 285, shown as time 340, ramp signal 290 may increase to a level 341. Level 341 may be based on level 331, ramp start value 310, ramp stop value 315, and ramp slope active value 272. In this manner, the level of ramp signal 290 may increase at each rising edge of clock signal 285. The example of FIG. 3 is shown with a rising edge of clock signal 285 initiating a change in ramp signal 290, but this is not intended to be limiting. Changes in the ramp signal may be initiated by a falling edge of clock signal 285.

At time 350, ramp signal 290 increases to the level of ramp stop value 315. The ramp signal stops increasing further. Ramp controller 280 may wait for the next trigger signal 283 to initiate a new ramp cycle.

Figure 4:
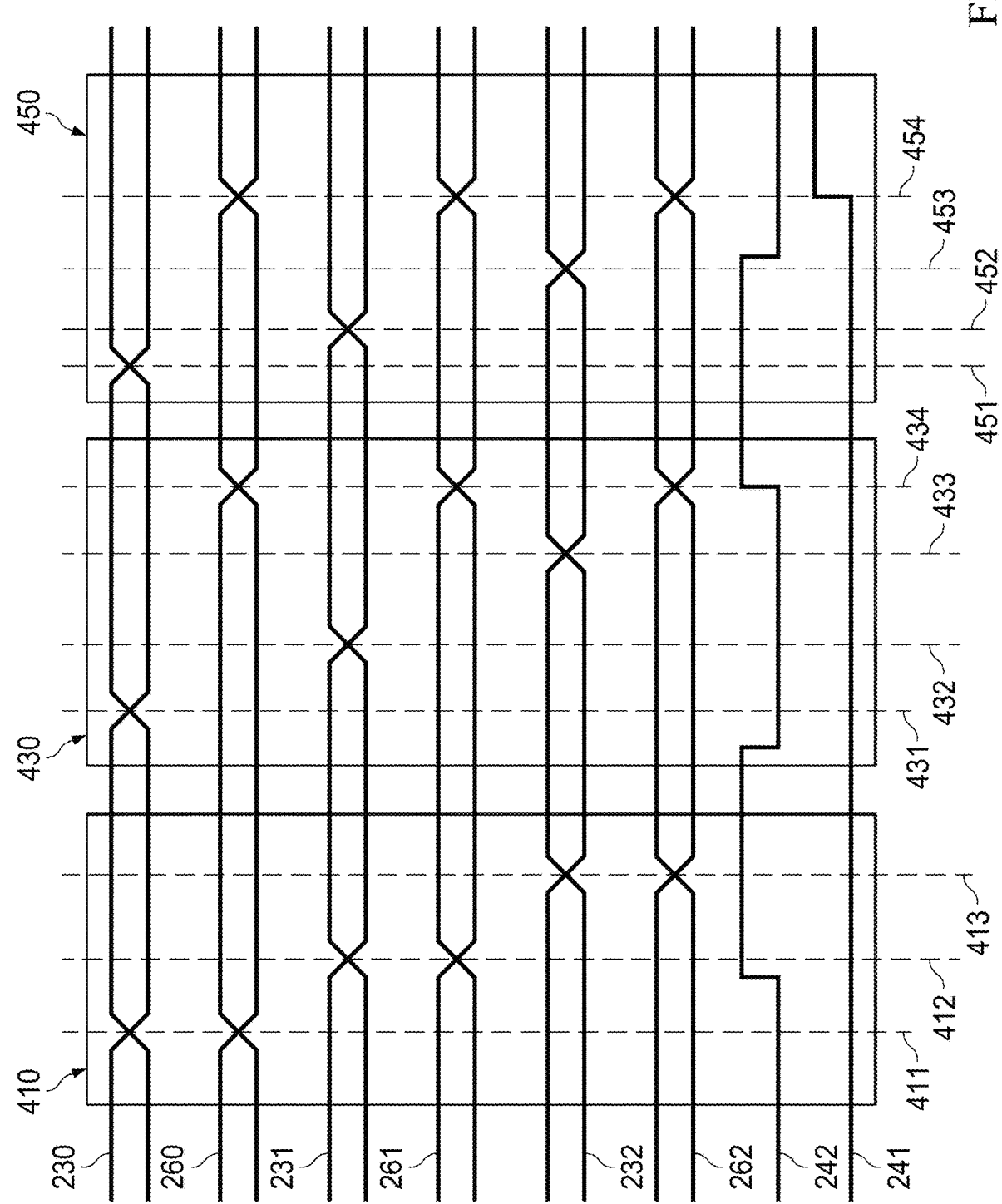

FIG. 4 illustrates one of various examples of operation of update controller 240. Update controller 240 may receive as input, respectively, ramp start program value 230, ramp stop program value 231, and ramp slope program value 232. Update controller may also receive input from external signal 241. Update controller 240 may also receive input from PWM signal 242. Update controller may update the values stored in, respectively, ramp start active register 260, ramp stop active register 261, and ramp slope active register 262.

As illustrated in FIG. 4, the region defined by box 410 may operate in an immediate update mode. At time 411, the contents of ramp start program register 220 may be updated, and thus ramp start program value 230 may change value. The contents of ramp start program register 220 may be updated based on a predetermined communication protocol transmitted to ramp start program register 220. The change of ramp start program value 230 may be initiated by a software or a hardware update to ramp start program register 220 as described above in relation to FIG. 2. The contents of ramp start active register 260 may be immediately updated to a new value which is reflective of the value of ramp start program value 230.

At time 412, the contents of ramp stop program register 221 may be updated, and thus ramp stop program value 231 may change value. The change of ramp stop program value 231 may be initiated by a software or a hardware update to ramp stop program register 221 as described in relation to FIG. 2. The contents of ramp stop active register 261 may be immediately updated to a new value which is reflective of the value of ramp stop program value 231.

At time 413, the contents of ramp slope program register 222 may be updated, and thus ramp slope program value 232 may change value. The change of ramp slope program value 232 may be initiated by a software or a hardware update to ramp slope program register 222 as described in relation to FIG. 2. The contents of ramp slope active register 262 may be immediately updated to a new value which is reflective of the value of ramp slope program value 232.

As illustrated in FIG. 4, the region defined by box 430 may operate in a PWM update mode. At time 431, the contents of ramp start program register 220 may be updated, and thus ramp start program value 230 may change value. The change of ramp start program value 230 may be initiated by a software or a hardware update to ramp start program register 220 as described in relation to FIG. 2. The value of ramp start active register 260 may not update at time 431.

At time 432, the contents of ramp stop program register 221 may be updated, and thus ramp stop program value 231 may change value. The change of ramp stop program value 231 may be initiated by a software or a hardware update to ramp stop program register 221 as described in relation to FIG. 2. The value of ramp stop active register 261 may not update at time 432.

At time 433, the contents of ramp slope program register 222 may be updated, and thus ramp slope program value 232 may change value. The change of ramp slope program value 232 may be initiated by a software or a hardware update to ramp slope program register 222 as described in relation to FIG. 2. The value of ramp slope active register 262 may not update at time 433.

At time 434, the value of PWM signal 242 may change from a low level to a high level. This transition may signal the end of a PWM period. Based on the operation in PWM update mode, the contents of ramp start active register 260, ramp stop active register 261 and ramp slope active register 262 may be updated at time 434, as illustrated in FIG. 4. The contents of ramp start active register 260 may be updated to reflect the value of ramp start program value 230. The contents of ramp stop active register 261 may be updated to reflect the value of ramp stop program value 231. The contents of ramp slope active register 262 may be updated to reflect the value of ramp slope program value 232.

The example illustrated in FIG. 4 illustrates registers updating at the rising edge of the PWM signal, but this is not intended to be limiting. Registers may update an any predetermined point in the PWM period.

As illustrated in FIG. 4, the region defined by box 450 may operate in an external update mode. At time 451, the contents of ramp start program register 220 may be updated, and thus ramp start program value 230 may change value. The change of ramp start program value 230 may be initiated by a software or a hardware update to ramp start program register 220 as described in relation to FIG. 2. The value of ramp start active register 260 may not update at time 451.

At time 452, ramp stop program register 221 may be updated, and thus ramp stop program value 231 may change value. The change of ramp stop program value 231 may be initiated by a software or a hardware update to ramp stop program register 221 as described in relation to FIG. 2. The value of ramp stop active register 261 may not update at time 452.

At time 453, ramp slope program register 222 may be updated, and thus ramp slope program value 232 may change value. The change of ramp slope program value 232 may be initiated by a software or a hardware update to ramp slope program register 222 as described in relation to FIG. 2. The value of ramp slope active register 262 may not update at time 453.

At time 454, the value of external signal 241 may change from a low level to a high level. Based on the operation in external update mode, the contents of ramp start active register 260, ramp stop active register 261 and ramp slope active register 262 may be updated at time 454, as illustrated in FIG. 4. The contents of ramp start active register 260 may be updated to reflect the value of ramp start program value 230. The contents of ramp stop active register 261 may be updated to reflect the value of ramp stop program value 231. The contents of ramp slope active register 262 may be updated to reflect the value of ramp slope program value 232.

The example illustrated in FIG. 4 illustrates registers updating at the rising edge of external signal 241, but this is not intended to be limiting. Registers may update at a falling edge of external signal 241.

Figure 5:
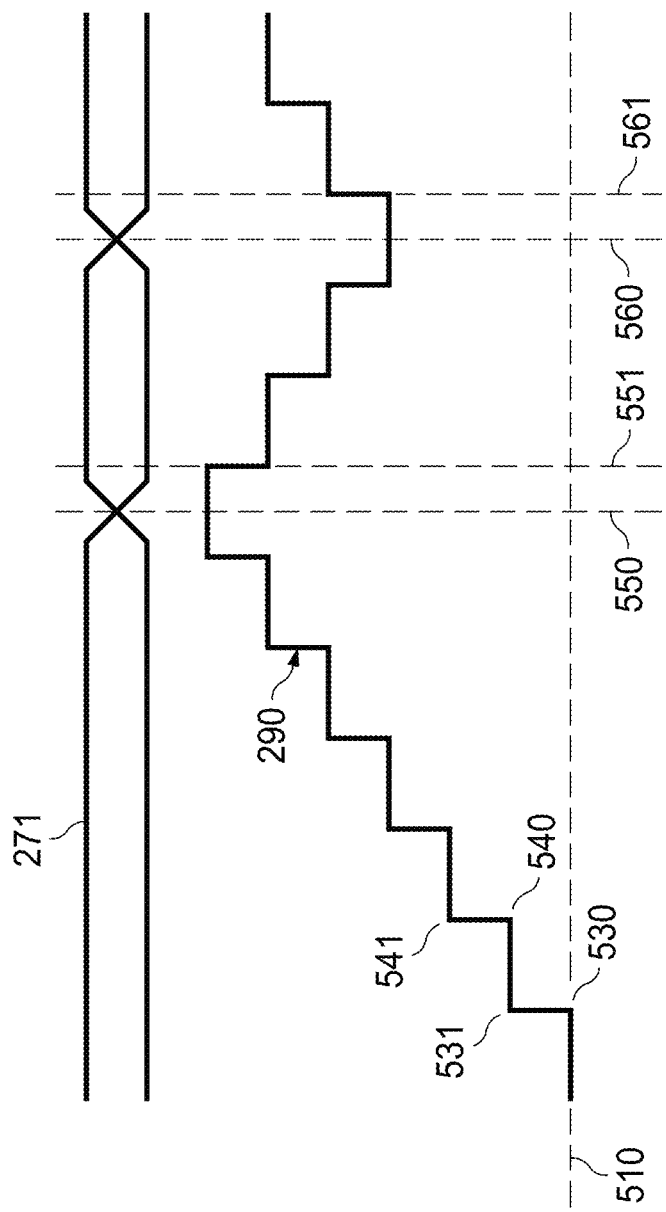

FIG. 5 illustrates one of various examples of update controller 240 and ramp controller 280 in operation to generate ramp signal 290. Ramp start active register 260 may be set to value 510. At time 530, ramp signal 290 may increase to level 531. Level 531 may be based on ramp start active value 270, ramp stop active value 271 and ramp slope active value 272. In one of various examples, ramp slope active value 272 may specify a slope in volts per time. Ramp controller 280 may set level 531 based on the ramp start active value 270, incrementing based on ramp slope active value 272, and ending at ramp stop active value 271. At time 540, ramp signal may 290 increase to level 541. Ramp signal 290 may continue to increase as illustrated and described previously in FIG. 3, based on the values of ramp start active value 270, ramp stop active value 271 and ramp slope active value 272. At time 550, ramp stop active value 271 may update in value. The update of ramp stop active value 271 may occur as illustrated in FIG. 4, in immediate update mode, PWM update mode, or update mode. In the example of FIG. 5, the updated value of ramp stop active value 271 is lower in amplitude than the previous value of ramp stop active value 271. At the next update in the ramp signal 290 at time 551, the updated value of ramp stop active value 271 may result in a decrease in ramp signal 290, by an amount reflective of ramp slope active value 272. Decreases in ramp signal 290 may continue until ramp signal 290 reaches the value of ramp stop active value 271 or until ramp stop active value 271 is updated.

At time 560, ramp stop active value 271 may update in value. The update of ramp stop active value 271 may occur as illustrated in FIG. 4, in immediate update mode, PWM update mode, or external update mode. In the example of FIG. 5, the updated value of ramp stop active value 271 is higher in amplitude than the previous value of ramp stop active value 271. At the next update in the ramp signal 290 at time 561, the updated value of ramp stop active value 271 may result in an increase in ramp signal 290 by an amount reflective of ramp slope active value 272. Increases in ramp signal 290 may continue until ramp signal 290 reaches the value of ramp stop active value 271 or until ramp stop active value 271 is updated.

The example of FIG. 5 illustrates ramp signal 290 updating with the value of ramp slope active value 272 being uniform over time, but this is not intended to be limiting. Ramp slope active value 272 may be updated and these updated values may take effect when the ramp stop active value 271 is updated.

The invention claimed is:

1. A device comprising:
   an input to receive a clock signal;
   a ramp start program register;
   a ramp start active register;
   a ramp stop program register;
   a ramp stop active register;
   a ramp slope program register;
   a ramp slope active register;
   an update controller, the update controller to update, based on a programmable condition, respectively, the ramp start active register contents with a content of the ramp start program register, the ramp stop active register contents with a content of the ramp stop program register contents and the ramp slope active register contents with a content of the ramp slope program register contents, and
   a ramp controller to generate a ramp signal, the ramp signal to begin at the value reflective of the ramp start active register contents, the ramp signal to change value at each cycle of the clock signal based at least on the value reflective of the ramp slope active register contents, and the ramp signal to stop at the value reflective of the ramp stop active register contents.

2. The device as claimed in claim 1, the programmable condition comprising a change in contents of at least one of the ramp start program register, the ramp slope program register and the ramp stop program register.

3. The device as claimed in claim 1, the programmable condition comprising the ramp signal reaching a value reflective of the ramp stop active register contents.

4. The device as claimed in claim 1, the programmable condition comprising the ramp signal reaching a value reflective of the ramp start active register contents.

5. The device as claimed in claim 1, the programmable condition comprising a change in polarity of an external signal.

6. The device as claimed in claim 1, the value reflective of the ramp slope program register contents and the value reflective of the ramp slope active register contents comprising a positive value.

7. The device as claimed in claim 1, the value reflective of the ramp slope program register contents and the value reflective of the ramp slope active register contents comprising a negative value.

8. A system comprising:
   an input to receive an input signal;
   an input to receive a clock signal;
   a ramp start program register;
   a ramp start active register;
   a ramp stop program register;
   a ramp stop active register;
   a ramp slope program register;
   a ramp slope active register;
   an update controller to update, based on a programmable condition, respectively, the ramp start active register contents with a content of the ramp start program register, the ramp stop active register contents with a content of the ramp stop program register, and the ramp slope active register contents with a content of the ramp slope program register, and
   a ramp controller to generate a ramp signal, the ramp signal to begin at a value reflective of the ramp start active register contents, the ramp signal to change value at each cycle of the clock signal based on a value reflective of the ramp slope active register contents, and the ramp signal to stop at a value reflective of the ramp stop active register contents, and a comparator to compare the input signal to the ramp signal and to output a PWM signal.

9. The system as claimed in claim 8, the programmable condition comprising a change in contents of at least one of the ramp start program register, the ramp slope program register and the ramp stop program register.

10. The system as claimed in claim 8, the programmable condition comprising the ramp signal reaching the value reflective of the ramp stop active register contents.

11. The system as claimed in claim 8, the programmable condition comprising the ramp signal reaching the value reflective of the ramp start active register contents.

12. The system as claimed in claim 8, the programmable condition comprising the end of a period of the PWM signal.

13. The system as claimed in claim 8, the programmable condition comprising a change in polarity of an external signal.

14. The system as claimed in claim 8, the value reflective of the ramp slope program register contents and the value reflective of the ramp slope active register contents comprising a positive value.

15. The system as claimed in claim 8, the value reflective of the ramp slope program register contents and the value reflective of the ramp slope active register contents comprising a negative value.

16. A method comprising:

generating a ramp signal, the ramp signal to begin at a value reflective of a ramp start active register contents, the ramp signal to change value at each cycle of a clock signal based at least on a value reflective of a ramp slope active register contents, and the ramp signal to stop at a value reflective of the ramp stop active register contents;

updating, based on a programmable condition, respectively, the ramp start active register contents with a value reflective of the ramp start program register contents, the ramp stop active register contents with a value reflective of the ramp stop program register contents, and the ramp slope active register contents with a value reflective of the ramp slope program register contents, and generating a PWM signal based on a comparison of the ramp signal and an input signal.

17. The method as claimed in claim 16, the programmable condition comprising a change in the contents of at least one of a ramp start program register, a ramp slope program register and a ramp stop program register.

18. The method as claimed in claim 16, the programmable condition comprising the ramp signal reaching the value reflective of the ramp stop active register contents.

19. The method as claimed in claim 16, the programmable condition comprising the ramp signal reaching the value reflective of the ramp start active register contents.

20. The method as claimed in claim 16, the programmable condition comprising a change in polarity of an input control signal.

21. The method as claimed in claim 16, the programmable condition comprising the end of a period of the PWM signal.

22. The method as claimed in claim 16, the value reflective of the ramp slope program register contents and the value reflective of the ramp slope active register contents comprising a positive value.

23. The method as claimed in claim 16, the value reflective of the ramp slope program register contents and the value reflective of the ramp slope active register contents comprising a negative value.

\* \* \* \* \*